(12) United States Patent
Christiansen et al.

(10) Patent No.: US 10,342,151 B2
(45) Date of Patent: Jul. 2, 2019

(54) CIRCUIT CARD RACK SYSTEM AND METHOD

(71) Applicants: Martin Brokner Christiansen, Laurel, MD (US); Leonard George Chorosinski, Ellicott City, MD (US); H. Craig Heffner, Ellicott City, MD (US); Stanley Katsuyoshi Wakamiya, Ellicott City, MD (US)

(72) Inventors: Martin Brokner Christiansen, Laurel, MD (US); Leonard George Chorosinski, Ellicott City, MD (US); H. Craig Heffner, Ellicott City, MD (US); Stanley Katsuyoshi Wakamiya, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/178,259

(22) Filed: Nov. 1, 2018

(65) Prior Publication Data

US 2019/0082551 A1 Mar. 14, 2019

Related U.S. Application Data

(62) Division of application No. 14/943,385, filed on Nov. 17, 2015, now Pat. No. 10,159,161.

(51) Int. Cl.
*H05K 7/00* (2006.01)
*H05K 7/20* (2006.01)
*H05K 7/14* (2006.01)

(52) U.S. Cl.
CPC ......... *H05K 7/1404* (2013.01); *H05K 7/1425* (2013.01); *H05K 7/20* (2013.01)

(58) Field of Classification Search
None
See application file for complete search history.

(56) References Cited

U.S. PATENT DOCUMENTS

| | | | |
|---|---|---|---|
| 5,002,496 A | 3/1991 | Fox, Jr. | |
| 5,057,968 A * | 10/1991 | Morrison | H05K 7/1404 165/104.33 |
| 5,222,668 A * | 6/1993 | Frankeny | H01R 12/853 439/197 |
| 5,813,876 A * | 9/1998 | Rutigliano | H01R 12/853 439/260 |

(Continued)

*Primary Examiner* — Courtney L Smith
*Assistant Examiner* — Rashen E Morrison
(74) *Attorney, Agent, or Firm* — Tarolli, Sundheim, Covell & Tummino LLP

(57) ABSTRACT

A method of maintaining a circuit card in a card rack and a circuit card rack system are disclosed. A card rack including a laterally oriented clamping slot is provided. The clamping slot is at least partially formed from a temperature-contractible material. A circuit card having a clamped side region is provided. At least a portion of the clamped side region is inserted into the clamping slot. A predetermined temperature differential is applied to the clamping slot to reduce a longitudinal dimension of at least a portion of the clamping slot. A compressive force is exerted on the portion of the clamped side region which is located longitudinally within the clamping slot, via thermal expansion of the clamping slot.

10 Claims, 10 Drawing Sheets

(56) References Cited

U.S. PATENT DOCUMENTS

| | | |
|---|---|---|
| 6,285,564 B1 | 9/2001 | O'Brien et al. |
| 7,308,738 B2 | 12/2007 | Barvosa-Carter et al. |
| 7,836,564 B2 * | 11/2010 | Barvosa-Carter ............................ A44B 18/0003 24/442 |
| 8,045,332 B2 | 10/2011 | Lee et al. |
| 8,250,725 B2 * | 8/2012 | Sigler ................. B29C 37/0085 156/293 |
| 8,780,556 B1 * | 7/2014 | Ditri .................... H05K 7/1404 165/80.2 |
| 9,108,279 B2 * | 8/2015 | Winkler ................... B21J 1/006 |
| 2004/0074069 A1 * | 4/2004 | Browne .................... F16B 5/07 24/442 |
| 2004/0117955 A1 * | 6/2004 | Barvosa-Carter ............................ A44B 18/0003 24/442 |
| 2006/0019510 A1 * | 1/2006 | Rudduck ............... F16B 1/0014 439/74 |
| 2006/0186706 A1 * | 8/2006 | Browne ................ B60K 37/06 296/203.01 |
| 2010/0020514 A1 * | 1/2010 | Lee ...................... H05K 7/1404 361/801 |
| 2017/0142856 A1 * | 5/2017 | Christiansen ........ H05K 7/1425 |

\* cited by examiner

CIRCUIT CARD RACK SYSTEM AND METHOD

RELATED APPLICATIONS

This application claims priority from U.S. patent application Ser. No. 14/943,385, filed 17 Nov. 2015, which is incorporated herein in its entirety.

TECHNICAL FIELD

This disclosure relates to an apparatus and method for use of a circuit card rack system and, more particularly, to a circuit card rack system and a method of maintaining a circuit card in a circuit rack.

BACKGROUND

It may be desirable to install modules (e.g., chip-carrying circuit cards, printed wiring boards, or the like) in a card rack for a cryogenic application, such as a superconducting supercomputer. In this use application, it may be desirable both to accommodate large modules and to provide uniform clamping force between the cards and the rack. The card rack should maintain clamping force at cryogenic temperatures (e.g., less than or equal to about 123K), and low thermal resistance between the rack and the card(s) carried thereby is required. Desired thermal performance can be achieved by uniform contact pressure between the cards and the card rack.

The current state of the art approach to module/card rack installation includes the use of wedgelocks. These have been used in currently known assemblies. The limitation of the wedgelock approach is that both the card rack and module/card must of the same material in order to achieve desired thermal conductivity in the use environment. In addition, the wedgelock system requires multiple very small shims or wedges, adding complexity to assembly of the system. Wedgelocks are also extremely expensive, with multiple wedgelocks needed for a particular instance of a card rack system. There is also a risk of adverse effects to the system if a wedgelock malfunctions (e.g., does not clamp as intended) or is located out of position (e.g., falls loose and interferes with electrical connections in the system). Finally, because wedgelocks are present at discrete sites along the card slots, there are local high/low clamping force areas along the length of the card slot, as well as relatively low thermal transfer between the modules and the card rack because of the noncontiguous placement of the wedgelocks along the card slot.

SUMMARY

In an embodiment, a method of maintaining a circuit card in a card rack is disclosed. A card rack including a laterally oriented clamping slot is provided. The clamping slot is at least partially formed from a temperature-contractible material. A circuit card having a clamped side region is provided. At least a portion of the clamped side region is inserted into the clamping slot. A predetermined temperature differential is applied to the clamping slot to reduce a longitudinal dimension of at least a portion of the clamping slot. A compressive force is exerted on the portion of the clamped side region which is located longitudinally within the clamping slot, via thermal expansion of the clamping slot.

In an embodiment, a circuit card rack system is provided. A card rack includes a laterally oriented clamping slot. The clamping slot is at least partially formed from a temperature-contractible material. A circuit card has a clamped side region. The circuit card has an operative configuration with at least a portion of the clamped side region being inserted into the clamping slot. When the circuit card is in the operative configuration, applying a predetermined temperature differential to the clamping slot reduces a longitudinal dimension of at least a portion of the clamping slot via thermal expansion of the clamping slot, thus causing exertion of a compressive force on the portion of the clamped side region which is located longitudinally within the clamping slot.

BRIEF DESCRIPTION OF THE DRAWINGS

For a better understanding, reference may be made to the accompanying drawings, in which.

DESCRIPTION OF ASPECTS OF THE DISCLOSURE

This technology comprises, consists of, or consists essentially of the following features, in any combination.

Though certain of the Figures may include gaps between components, it should be understood that the Figures are schematic, and that these gaps are included for ease of depiction. There may or may not actually be a gap between these components in actuality, and one of ordinary skill in the art can readily determine (optionally with reference to the text and drawings of this application) the presence or absence of gaps in a particular use environment for a particular operational condition of the depicted components, without regard to the presence or absence of gaps in the Figures.

It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "directly adjacent" another feature may have portions that overlap or underlie the adjacent feature, whereas a structure or feature that is disposed "adjacent" another feature may not have portions that overlap or underlie the adjacent feature.

Spatially relative terms, such as "under," "below," "lower," "over," "upper" and the like, may be used herein for ease of description to describe one element or feature's relationship to another element(s) or feature(s) as illustrated in the figures. It will be understood that the spatially relative terms can encompass different orientations of a device in use or operation, in addition to the orientation depicted in the figures. For example, if a device in the figures is inverted, elements described as "under" or "beneath" other elements or features would then be oriented "over" the other elements or features.

It will be understood that, although the terms "first," "second," etc. may be used herein to describe various elements, these elements should not be limited by these terms. These terms are only used to distinguish one element from another. Thus, a "first" element discussed below could also be termed a "second" element without departing from the teachings of the present disclosure. The sequence of operations (or steps) is not limited to the order presented in the claims or figures unless specifically indicated otherwise.

Figure 1A:
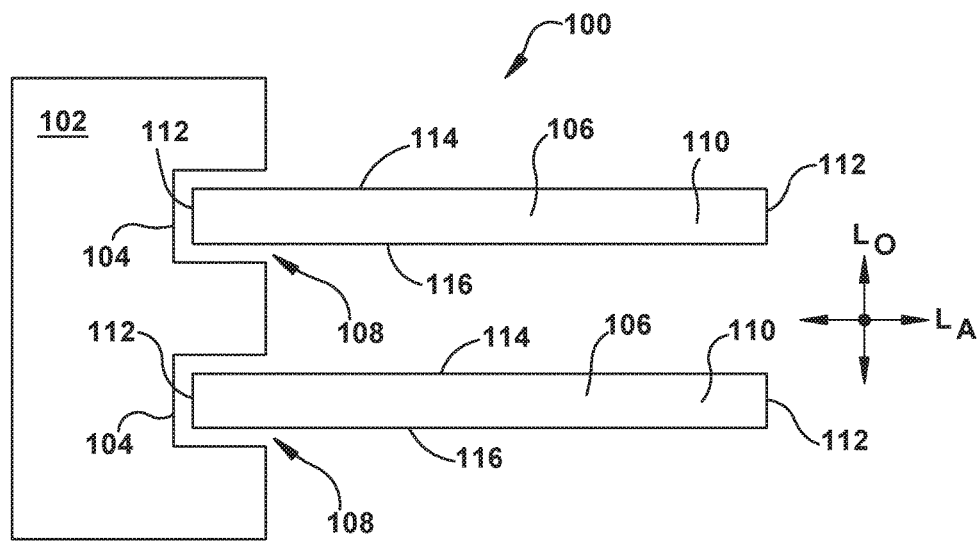
FIG. 1A is a schematic partial side view of one aspect of the invention.
Figure 1B:
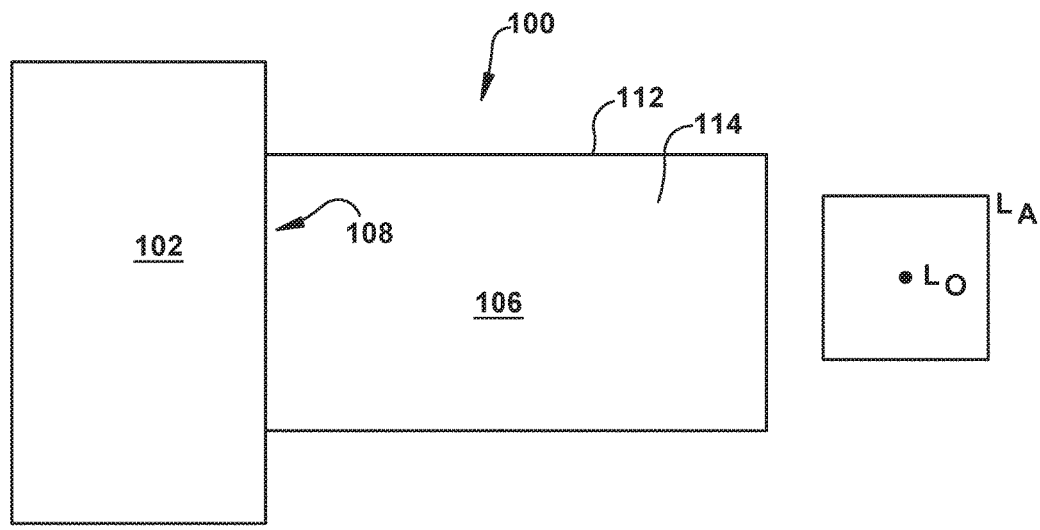
FIG. 1B is a schematic partial top view of the aspect of FIG. 1A.

FIGS. 1A-1B depict a circuit card rack system 100. A card rack 102 includes a laterally oriented clamping slot 104. The lateral direction is indicated at $L_A$, and is in the left-right direction, in the orientation of FIG. 1A, and is within the plane of the page, in the orientation of FIG. 1B. The longitudinal direction ($L_O$) is substantially perpendicular to the lateral direction—in the top-bottom direction, in the orientation of FIG. 1A. The clamping slot 104 is at least partially formed from a temperature-contractible material.

A circuit card 106 has a clamped side region 108. It is contemplated that the circuit card 106 assembly shown schematically in the Figures may include a heat sink or other structure—the term "circuit card" is used herein to generally reference a card or substrate upon which one or more circuits are or can be located, along with any desired additional structures which would be recognized by one of ordinary skill in the art as associated with that card or substrate itself.

The circuit card 106 has an operative configuration with at least a portion of the clamped side region 108 being inserted into the clamping slot 104, such as the one-sided or cantilevered installation shown in FIGS. 1A-1B. The circuit card 106 may have a substantially planar circuit card body 110 including at least one laterally oriented side edge 112 and circuit card top and bottom surfaces, 114 and 116, respectively, longitudinally separated by the circuit card body 110. Optionally, all or part of the perimeter of the circuit card body 110 (as shown in FIG. 1B as a substantially rectilinear footprint in the lateral plane) may be a "side edge" 112, and one of ordinary skill in the art will understand what portions of a particular circuit card 106 are performing a "side edge" 112 function.

At least a portion of the side edge 112 is included in the clamped side region 108. In addition, for most use environments of the circuit card rack system 100, at least a portion of the circuit card top and bottom surfaces, 114 and 116 will also be included in the clamped side region. As a general principle, the clamped side region 108 will be a portion of the circuit card 106 which is located within the recess of the clamping slot 108, and optionally bears a direct relationship to the lateral depth of the clamping slot 108. One of ordinary skill in the art will be able to determine the bounds of a "clamped side region" 108 for a particular use environment of the circuit card rack system 100.

Figure 2A:
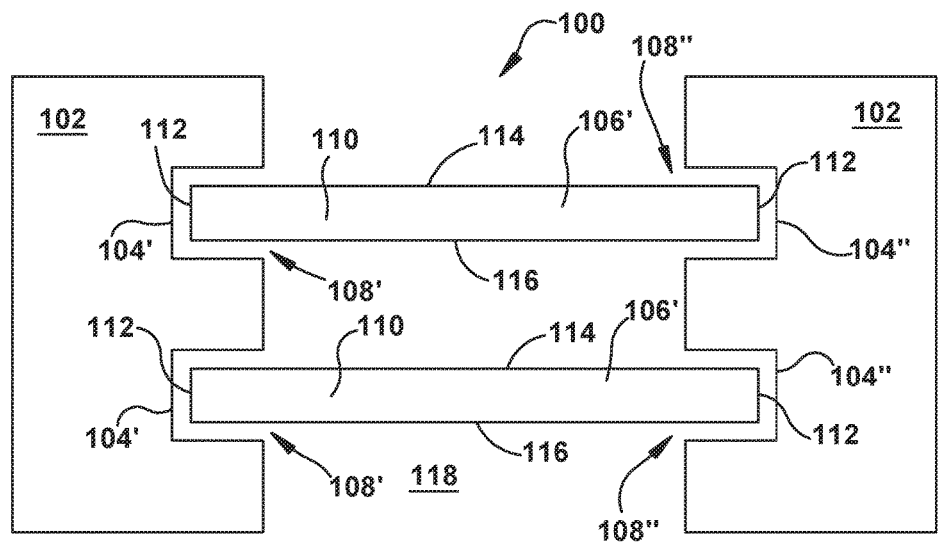
FIG. 2A is a schematic side view of the aspect of FIG. 1A.
Figure 2B:
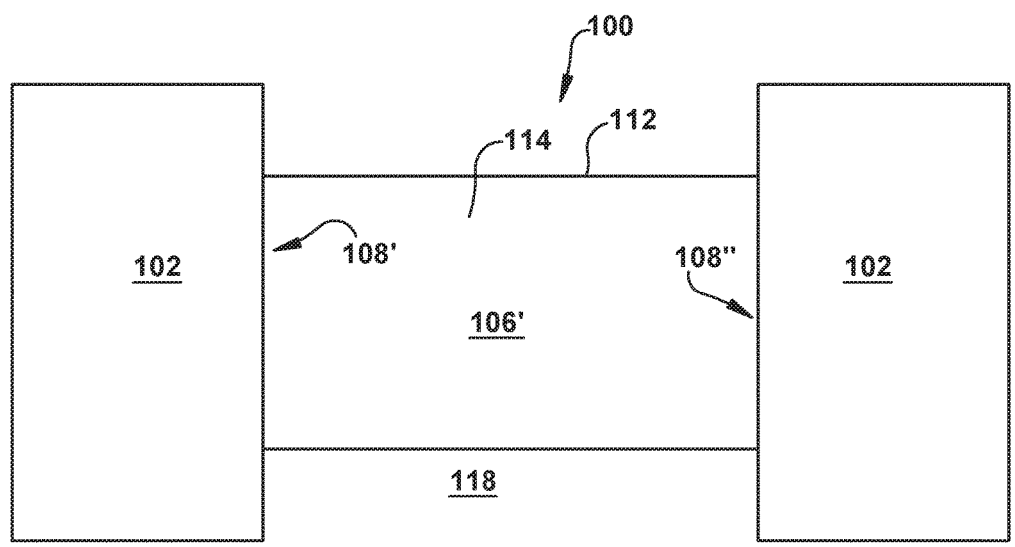
FIG. 2B is a schematic top view of the aspect of FIG. 2A.
Figure 3A:
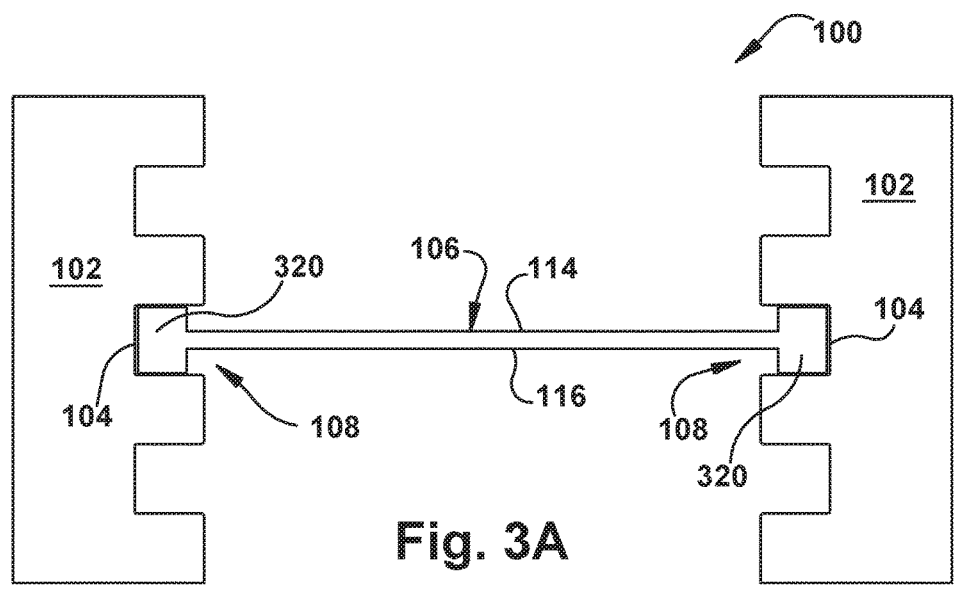
FIG. 3A is a schematic side view of the aspect of FIG. 1A with a first component option.
Figure 3B:
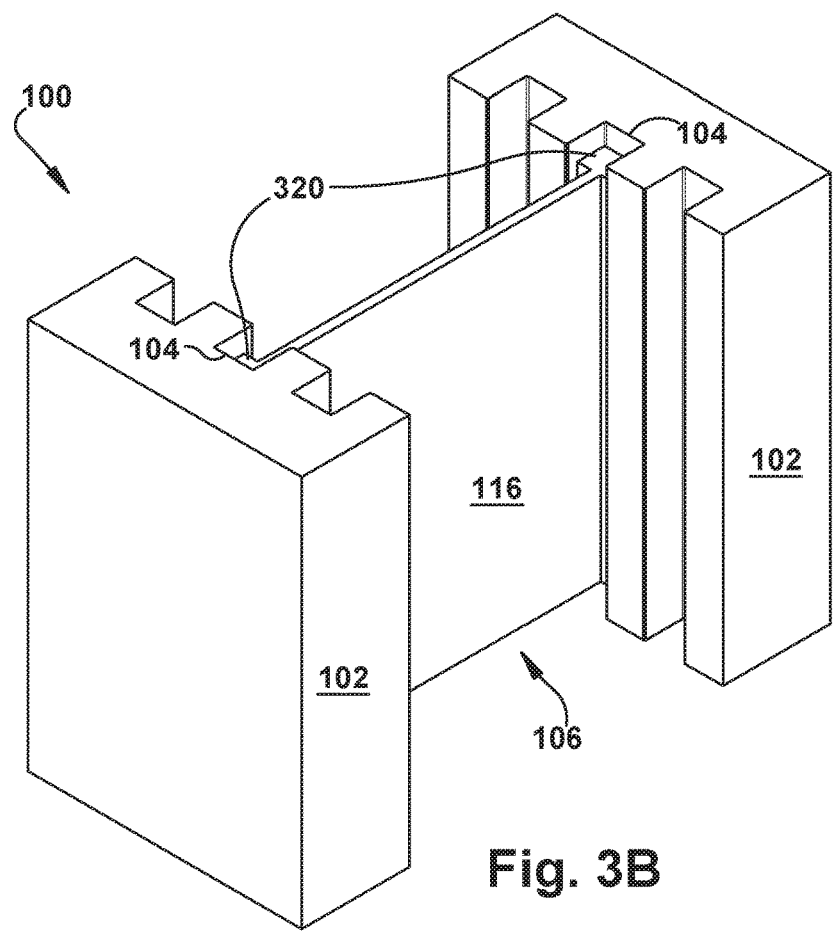
FIG. 3B is a perspective top view of FIG. 3A.

FIGS. 2A-2B are similar to FIGS. 1A-1B, except that, instead of the cantilevered configuration of FIGS. 1A-1B, the circuit cards 106 are supported on both sides by card racks 102. While the card racks 102 are shown schematically as being different structures in FIGS. 2A-2B, it is also contemplated that the card racks 102 could be part of a single structure. As with FIGS. 1A-1B, the circuit card rack system 100 of FIGS. 2A-2B is depicted as having a plurality of clamping slots 104, each of which is associated with a separate circuit card 106; however, it is contemplated that any number of clamping slots 104 and/or circuit cards 106 could be provided to a single circuit card rack system 100, and that there need not be a direct correspondence between the number of clamping slots 104 and the number of circuit cards 106 for a particular circuit card rack system 100.

With further reference to particularly FIG. 2A, the card rack 102 may include first and second laterally oriented, laterally spaced, longitudinally aligned clamping slots, 104' and 104", respectively, as shown in this Figure. (The "prime" and "double prime" marks are used herein to indicate portions of specific ones of numbered elements which are generally indicated, as a type, by an element number without such a superscript marking.)

Each of the first and second clamping slots 104' and 104" is disposed to one lateral side of an open card volume 118 of the card rack 102. When present, the first and second clamping slots 104' and 104" may each be at least partially formed from a temperature-contractible material. In this example, the circuit card 106 is a substantially planar circuit card 106' having first and second laterally spaced clamped side regions 108' and 108", respectively. The circuit card 106' shown in FIGS. 2A-2B has an operative configuration with at least a portion of the first clamped side region 108' being inserted into the first clamping slot 104' and at least a portion of the second clamped side region 108" being inserted into the second clamping slot 104". In this example, the circuit card 106' laterally spans at least a portion of the open card volume 118 of the card rack 102.

As will be discussed further below, and with reference to any circuit card rack system 100 (regardless of the Figure in which it is shown herein), when the circuit card 106 is in the operative configuration (i.e., with a desired amount of the clamped side region 108 being inserted into a corresponding clamping slot 104), applying a predetermined temperature differential to the clamping slot 104 reduces a longitudinal dimension of at least a portion of the clamping slot 104 via thermal expansion of the clamping slot 104, because the clamping slot 104 is at least partially formed from a temperature-contractible material. This dimensional reduction of the clamping slot 104 causes exertion of a compressive force on the portion of the clamped side region 108 which is located longitudinally within the clamping slot 104. For most use environments, the compressive force will be substantially longitudinally oriented. However, it is also contemplated that a laterally oriented compressive force could also or instead be exerted upon the clamped side region 108, such as by lateral dimensional reduction of the "blind end" (toward the left, in the orientation of FIG. 1A) and/or of at least one end face (when present) of the clamping slot 104, as desired.

The predetermined temperature differential may be a positive (heating) or a negative (cooling) temperature differential, as desired. For example, in a cryogenic use environment, the temperature differential will be negative. Likewise, the thermal expansion of the clamping slot 104 may be negative thermal expansion (i.e., contraction). The predetermined temperature differential may be provided in any desired manner such as, but not limited to, cooling/heating channels in the card rack 102, exposure of the entire circuit card rack system 100 to a desired heating/cooling energy, thermal siphon, cryogenic liquids, dilution refrigeration, Gifford-McMahon (GM) or pulse tube cryocoolers, local exposure of at least a portion of the clamping slot 104 to a heating/cooling agent (e.g., liquid nitrogen), or any combination of these or other temperature differential generating mechanism.

One of ordinary skill in the art will be able to configure at least one of the temperature-contractible material, any dimension of the clamping slot 104, any dimension of the clamped side region 108, and the temperature differential to achieve a predetermined compressive force between the clamping slot 104 and the clamped side region 108, as desired.

As an example, at least the clamping slot 104 portion of the card rack 102 and at least the clamped side region 108 of the circuit card 106 may be made from different materials, having different coefficients of thermal expansion ("CTE"). For example, the circuit card 106 could be made from steel and the card rack 102 from aluminum. At room temperature, the clamped side region 108 would slide in and out of the clamping slot 104 with a tight sliding fit (e.g., a gap therebetween of approximately 0.010"). It should be understood, though, that the gap between the clamped side region 108 and the clamping slot 104 could be adjusted for desired relative sliding functions (e.g., to make the circuit card 106 harder or easier to slide relative to the card rack 102) by the use of different materials.

As the circuit card rack system 100 is cooled to cryogenic temperatures, the card rack 102 reduces its size at a faster rate than does the circuit card 106, due to the difference in CTEs. The circuit card rack system 100 is "self-tightening", so does not need to be pre-tightened (thus resulting in greater thermal stresses over the cooling/heating cycle), as would a wedgelock system.

It is even contemplated that the clamped side region 108 may remain relatively constant-dimension, in some use applications for the circuit card rack system 100. In general, the geometry of the clamping slot 104 will reduce proportionally to its initial length. This means that the longitudinal dimension of the clamping slot 104 will be reduced by a larger total amount because the longitudinal dimension is much larger than the lateral dimension of the clamping slot 104.

Until clamping begins, no compressive force generated by the thermal mismatch stress will be applied to the circuit card 106. Clamping of the circuit card 106 will begin a predicted temperature that is determined by the CTEs of the materials of the clamping slot 104 and the clamped side region 108, and by the initial gap conditions between these two structures. When desired clamping force is present, the thermal performance will be realized and the remaining thermal stress-induced clamping force will be applied to the clamped side region 108. The clamping force (i.e., thermally-induced compressive force which acts to maintain the clamped side region 108 in the clamping slot 104) is at least partially determined by the material CTEs, initial gap, and the material moduli of elasticity (Young's Modulus).

Stated differently, the temperature-contractible material of the card rack 102 may be a first temperature-contractible material having a first coefficient of thermal expansion and the temperature differential is a first temperature differential. The circuit card 106, then, may be at least partially formed from a second temperature-contractible material different from the first temperature-contractible material and having a second coefficient of thermal expansion which is different from the first coefficient of thermal expansion. When the circuit card is in the operative configuration as shown in FIGS. 1A-2B, a selected one of the first temperature differential and a predetermined second temperature differential may be applied to the clamped side region 108 to reduce a longitudinal dimension of at least a portion of the clamped side region 108 via thermal expansion (which could be negative thermal expansion) of the clamped side region 108. The thermally-induced reduction of the longitudinal dimension of the clamped side region 108 is less than the thermally-induced reduction of the longitudinal dimension of a corresponding portion of the clamping slot 104. In this manner, the thermal expansion mismatch between the clamping slot 104 and the clamped side region 108 causes exertion of sufficient compressive force on the portion of the clamped side region 108 within the clamping slot 104 to maintain the circuit card 106 in the card rack 102.

With reference now to FIGS. 3A-7, various options for the circuit card rack system 100 are shown. In FIGS. 3A-4B, the circuit card 106 includes an edge feature 320 extending substantially along at least a portion of the side edge 112. For example, the edge feature 320 could be a "wedgelock replacement" adaptation allowing previously used circuit cards 106 to be adapted for use with a circuit card rack system 100. The edge feature 320 has a longitudinal thickness that is substantially greater than a laterally adjacent portion of the circuit card 106. That is, the edge feature 320 is substantially locally thicker than a portion of the circuit card 104 located laterally inward from the edge feature 320—though squared-off edge features 320 is shown, it is also contemplated that the edge feature 320 may have a more gradual transition to a remaining circuit card top and/or bottom surfaces 114 and 116. (Again, it should be noted that the "circuit card top and/or bottom surfaces 114 and 116" could include a heat sink to which a card substrate is mounted/laminated, or any other associated structures making up a general "circuit card" element.) As shown in FIGS. 3A-4B, the edge feature 320 may be at least partially inserted into the clamping slot 104 in the operative configuration.

Figure 4A:
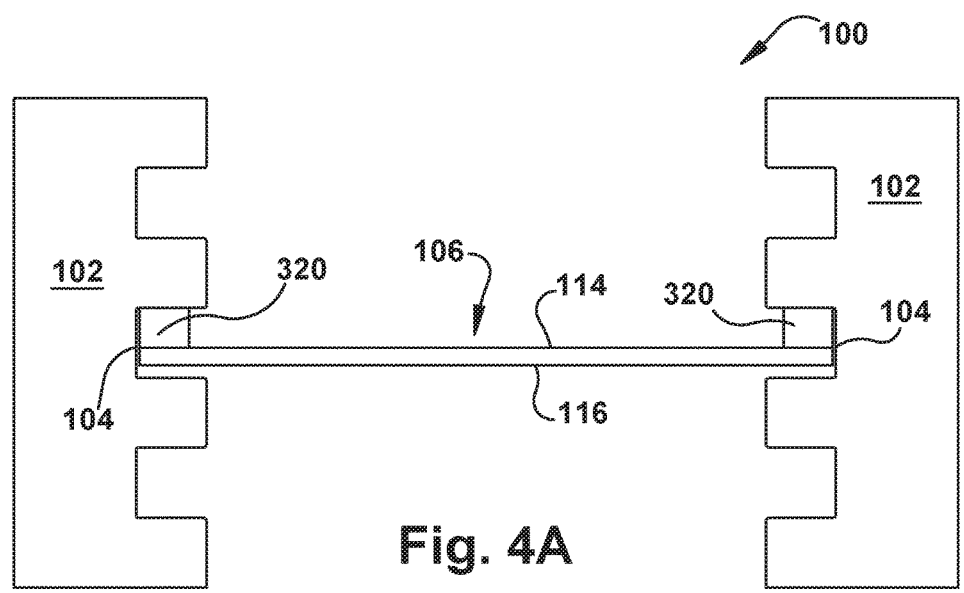
FIG. 4A is a schematic side view of the aspect of FIG. 1A with a second component option.
Figure 4B:
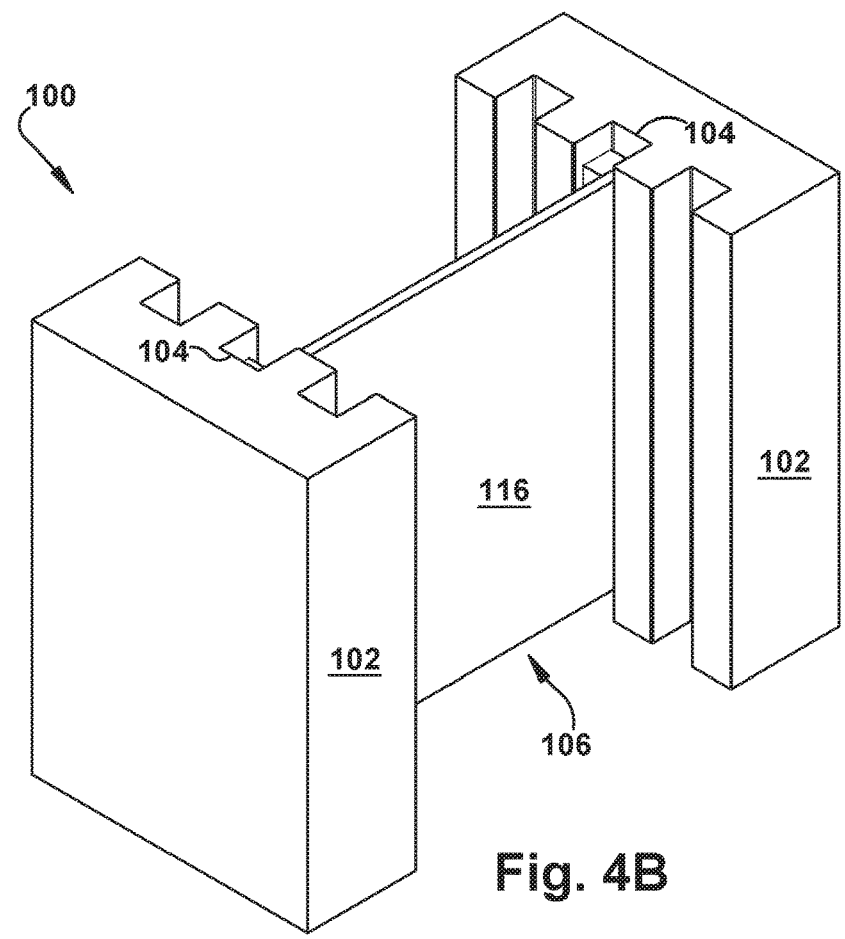
FIG. 4B is a perspective top view of FIG. 4A.
Figure 5A:
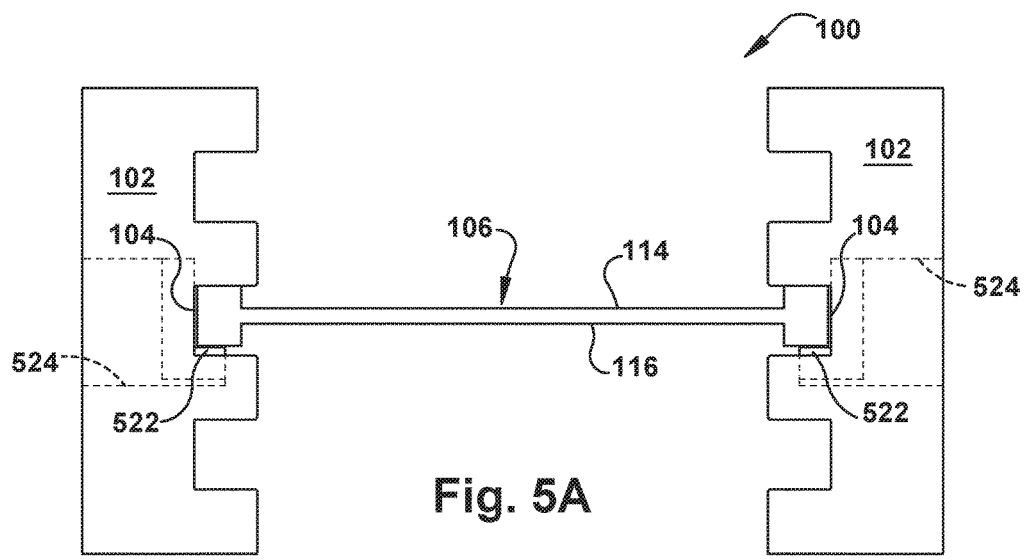
FIG. 5A is a schematic side view of the aspect of FIG. 1A with a third component option.
Figure 5B:
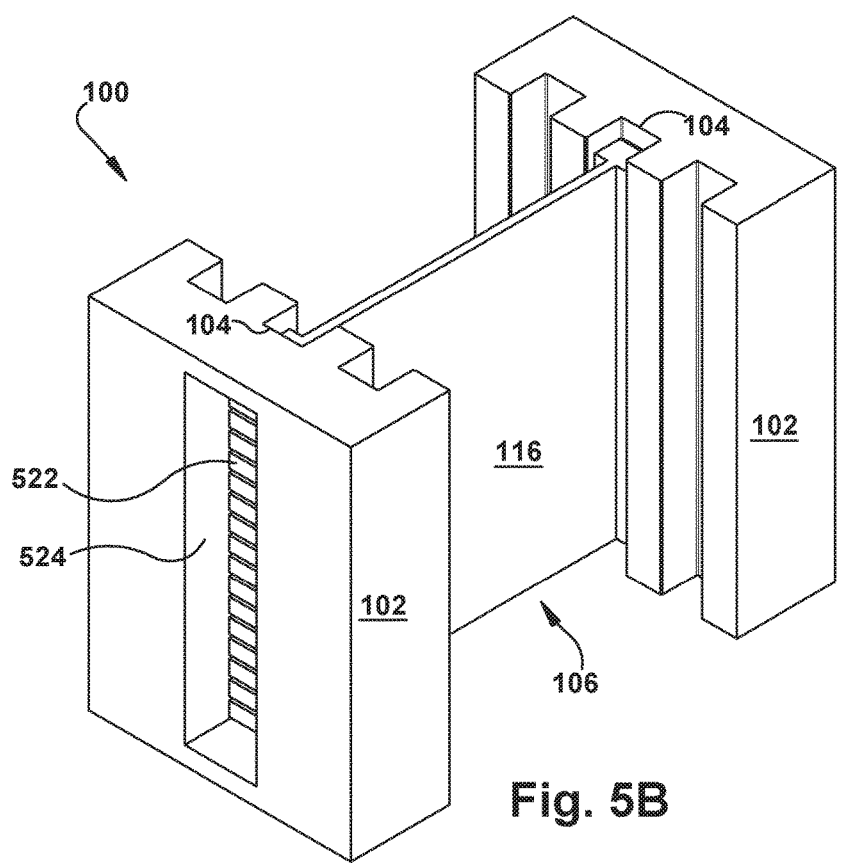
FIG. 5B is a perspective top view of FIG. 5A.
Figure 6A:
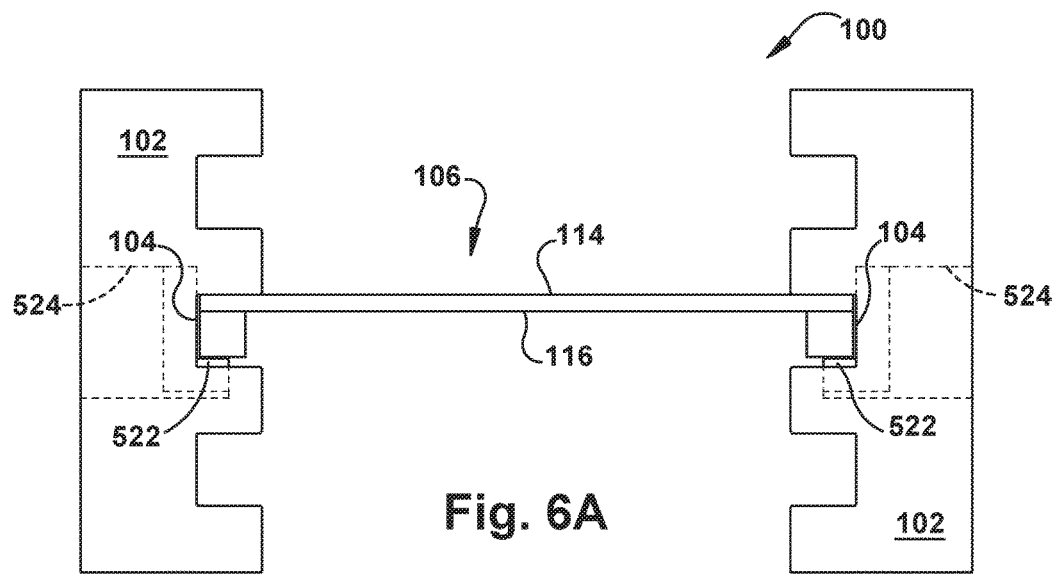
FIG. 6A is a schematic side view of the aspect of FIG. 1A with a fourth component option.
Figure 6B:
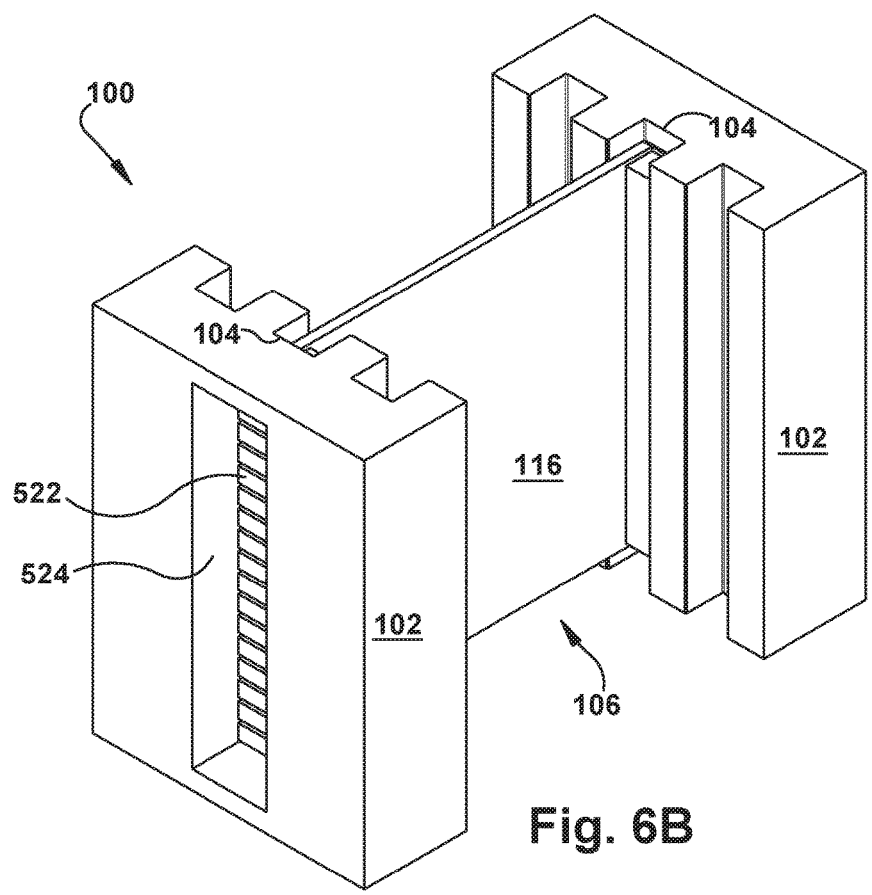
FIG. 6B is a perspective top view of FIG. 6A.

The difference between the arrangements shown in FIGS. 3A-3B and 4A-4B is that, in the former, the edge feature 320 is partially on the circuit card top surface 114 and partially on the circuit card bottom surface 116, thus "suspending" the majority of the circuit card 106 longitudinally between the top and bottom faces of the clamping slot 104—i.e., "in-plane". In contrast, in the latter Figures, the edge feature 320 is wholly on a chosen one of the circuit card top and bottom surfaces 114 and 116, thus "pinning" the other of the circuit card top and bottom surfaces 114 and 116 against a respective top or bottom face of the clamping slot 104. FIGS. 4A-4B show the edge feature 320 as being on the circuit card top surface 114, but the edge feature 320 could instead be on the circuit card bottom surface 116—basically, inverting the views of FIGS. 4A-4B.

Turning now to FIGS. 5A-7, at least one spacer 522 could be interposed between at least a portion of the clamped side region 108 and at least a portion of the clamping slot 104. For example, as shown in FIGS. 5B and 6B, a plurality of relatively small spacers 522 could be lined up along the clamped side region 108, which would allow for flexibility in the length of the interface between the spacers 522 and the clamped side region 108. Optionally, and as shown, a rack aperture 524 could be provided to the card rack(s) 102, to facilitate access to the spacers 522 from a side of the card rack 102 opposite the clamping slot 104.

FIGS. 5A-5B and 6A-6B show, respectively, two different configurations of edge features 320 with spacers 522. However, it is also contemplated that one or more spacers 522 could be provided to a circuit card 106 without an edge feature 320.

Figure 7:
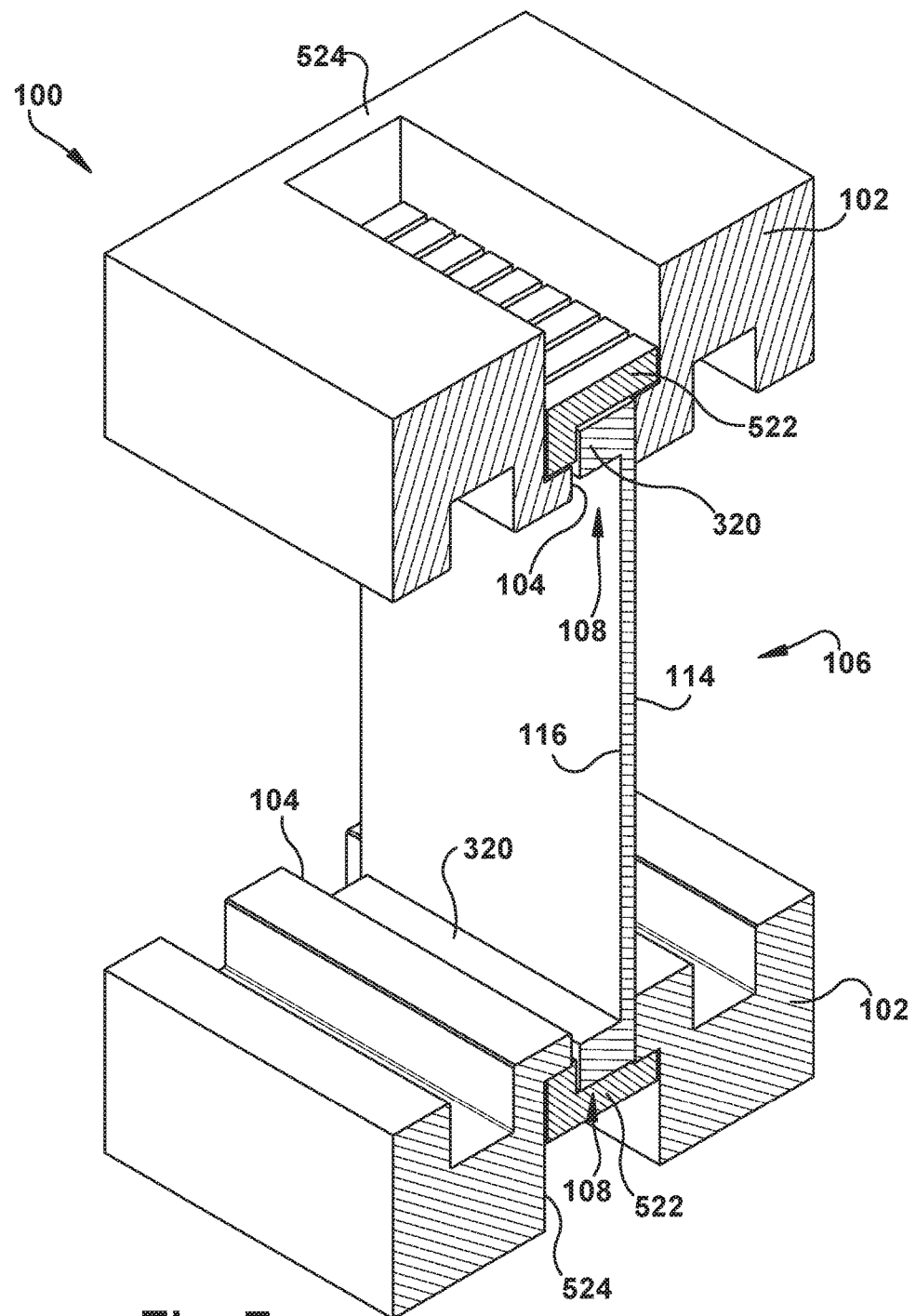
FIG. 7 is a perspective side view of the aspect of FIG. 6A.

As depicted in FIG. 7, the spacers 522, when present, may be L-shaped (or any other shape, as desired) "shim" type structures which can be used to at least partially occupy a portion of the clamping slot 104 which is not occupied by the clamped side region 108. For example, and as shown, the spacers 522 may be used to "snug up" the circuit card 106 by pressing the clamped side region 108 longitudinally against one face of the clamping slot 104. This may allow for different dimensional tolerances between the structures of the circuit card rack system 100, even facilitate the use of different thickness, or differently configured, circuit cards 106 with a single card rack 102 configuration.

The spacers 522, when present, may be made of the same material as one or both of the clamping slot 104 and the clamped side region 108, or may be made of a different material than either. For example, the spacers 522 may be made from Delrin® acetal homopolymer resin, available from Dupont USA of Wilmington, Del. The spacers 522 may have a different CTE than at least the portion of the clamping slot 104 directly adjacent to the spacers 522. For example, Delrin® spacers have a larger CTE than most metals, which will facilitate allowing a larger gap between the clamping slot 104 and the clamped side region 108 at room temperature, thus facilitating slide-in of the circuit card 106 into the card rack 102.

Figure 8:
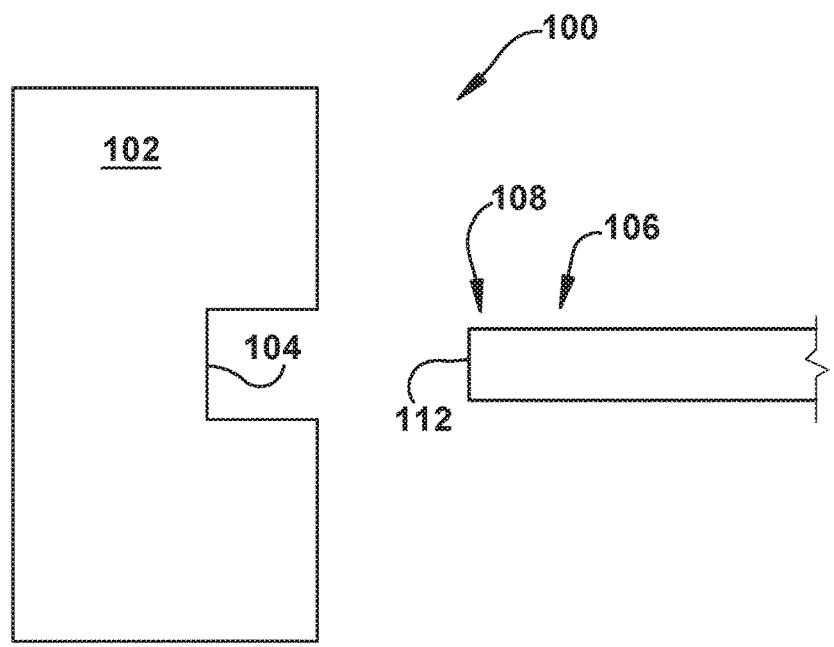
FIGS. 8-11 depict a sequence of operation of any configuration of the aspect of FIG. 1A.
Figure 9:
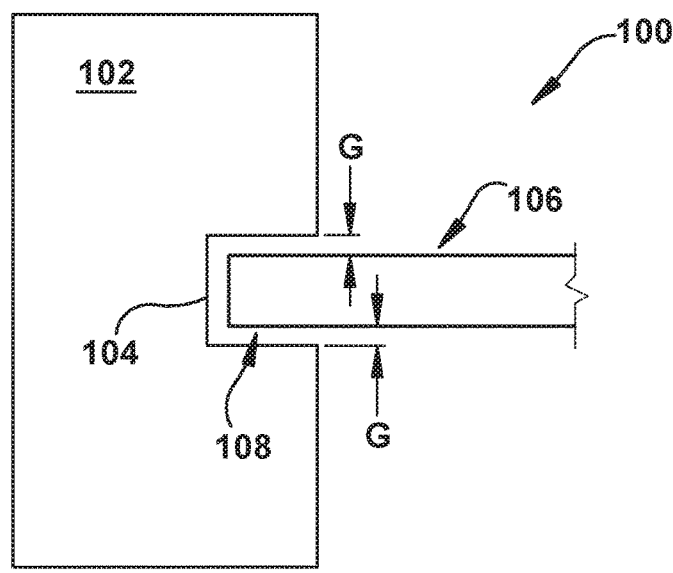

FIGS. 8-11 illustrate an example sequence of use of the circuit card rack system 100. In FIG. 8, the circuit card 106 is placed (e.g., slid) into the card rack to position the clamped side region 108 into the clamping slot 104. As shown in FIG. 9, a gap "G" between the clamped side region 108 and the clamping slot 104 exists, which allows for the circuit card 106 to be adjusted into a desired operative configuration.

Figure 10:
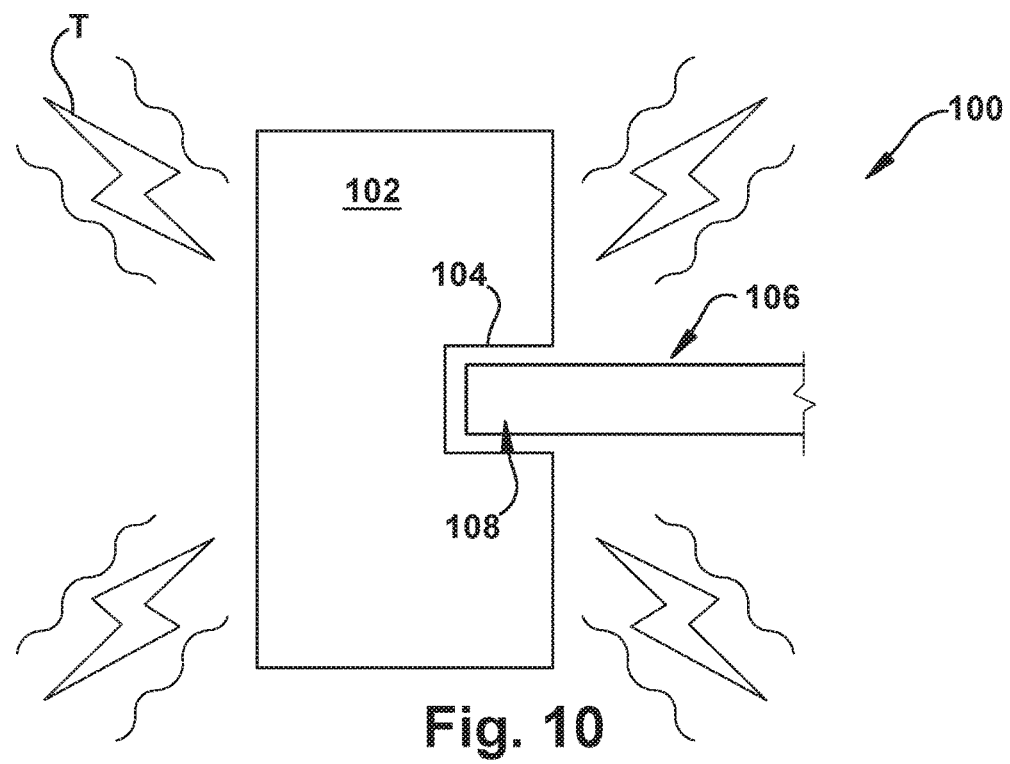
Figure 11:
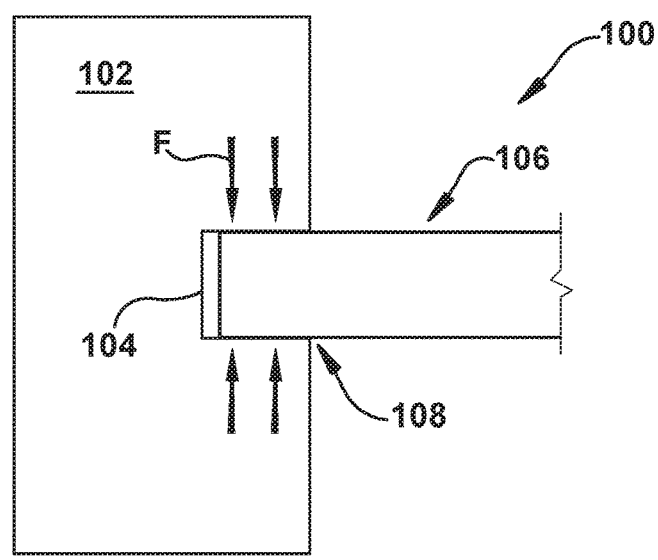

In FIG. 10, a predetermined temperature differential "T" is applied to at least a portion of the clamping slot 104 in any suitable manner, and optionally also to at least a portion of the clamped side region 108. The predetermined temperature differential reduces a longitudinal dimension of at least a portion of the clamping slot 104, thus causing exertion of a compressive force "F" on the portion of the clamped side region 108 which is located longitudinally within the clamping slot 104, via thermal expansion (which, again, could be negative thermal expansion) of the clamping slot 104, as shown in FIG. 11. For most use environments of the circuit card rack system 100, there will be sufficient compressive force exerted on the portion of the clamped side region 108 to maintain the circuit card 106 in the card rack 102.

As long as the circuit card 106 is desired to be maintained under the compressive force F, the predetermined temperature differential T could be maintained at a steady-state temperature chosen (optionally in conjunction with specific dimensions and materials of the circuit card rack system 100) to maintain the compressive force F. When the clamping slot 104 is exerting a compressive force F on the portion of the clamped side region 108 which is located longitudinally within the clamping slot 104, this compressive force F can be reduced by applying a predetermined temperature differential to the clamping slot 104 to increase a longitudinal dimension of at least a portion of the clamping slot 104 and thereby reduce the compressive force being exerted— i.e., the clamping process is reversed. Once the compressive force F has been sufficiently reduced, the circuit card 106 may be removed from the card rack 102

Figure 12:
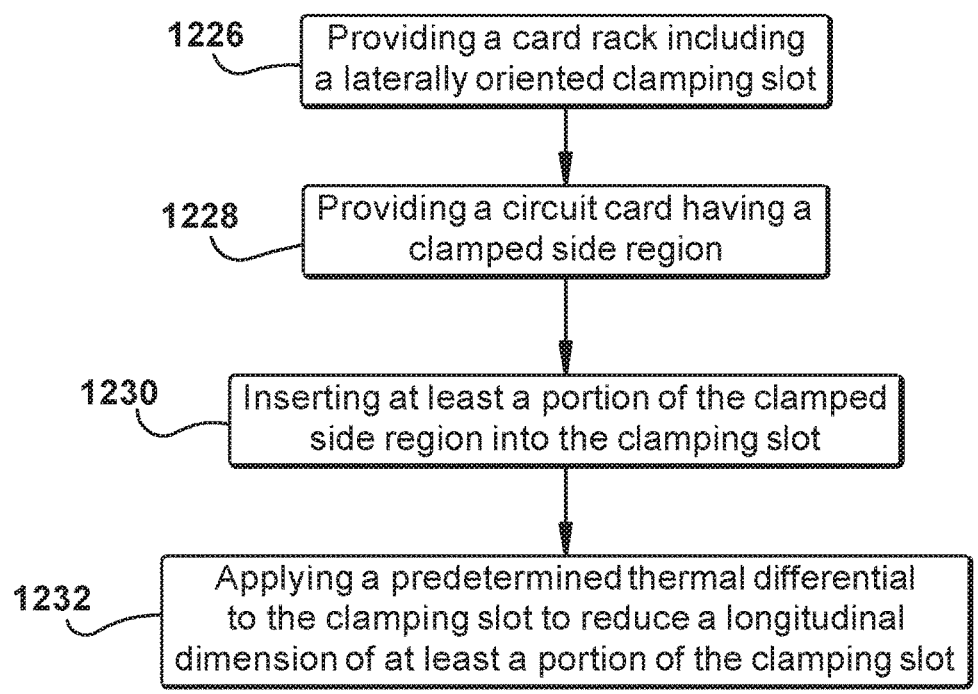
FIG. 12 is a flowchart illustrating a method of operation of any configuration of the aspect of FIG. 1A.

FIG. 12 is a flowchart depicting at least a portion of an example sequence of operation of the circuit card rack system 100. In first action block 1226, a card rack 102 including a laterally oriented clamping slot 104 is provided. In second action block 1228, a circuit card 106 having a clamped side region 108 is provided. In third action block 1230, at least a portion of the clamped side region 108 of the circuit card 106 is inserted into the clamping slot 104 of the card rack 102. In fourth action block 1232, a predetermined temperature differential is applied to the clamping slot 104 to reduce a longitudinal dimension of at least a portion of the clamping slot 104. A compressive force F is then exerted on the portion of the clamped side region 108 which is located longitudinally within the clamping slot 104, via thermal expansion of the clamping slot 104.

The above description presumes that the clamped side region 108 and the clamping slot 104 are each comprised of a homogenous temperature-contractible material. However, it is contemplated that the clamped side region 108 and/or the clamping slot 104 could additionally or alternatively be comprised of a combination of materials (e.g., a stack of different materials, a laminate, an alloy, a composite, or any other multi-material combinations), and thus the relative CTEs can be "tuned" for particular clamping results.

In addition to the compressive force developed between the clamped side region 108 and the clamping slot 104, this connection can also assist with providing a large-surface-area interface to assist with thermal energy transfer between the circuit card 106 and the card rack 102. For a conventional wedgelock, the material that is being pressed into the card rack provides the primary thermal interface. The direction through the wedgelock is an inferior thermal path because it includes additional surface resistances and it has a reduced cross section (wedgelocks have hollow parts to allow articulation). This problem is reduced by the constant and relatively large surface contact between the clamped side region 108 and the clamping slot 104. In contrast, a supermajority of a surface area of the clamping slot 104 of the circuit card rack system 100 is in thermal contact with a supermajority of a surface area of the clamped side region 108 to achieve a predetermined rate of thermal energy transfer therebetween, this predetermined rate of thermal energy transfer being significantly higher than a similar rate achievable through a thermal path using known wedgelock clamping systems.

While aspects of this disclosure have been particularly shown and described with reference to the example embodiments above, it will be understood by those of ordinary skill in the art that various additional embodiments may be contemplated. For example, the specific methods described above for using the apparatus are merely illustrative; one of ordinary skill in the art could readily determine any number of tools, sequences of steps, or other means/options for placing the above-described apparatus, or components thereof, into positions substantively similar to those shown and described herein. Any of the described structures and components could be integrally formed as a single unitary or monolithic piece or made up of separate sub-components, with either of these formations involving any suitable stock or bespoke components and/or any suitable material or combinations of materials. Any of the described structures and components could be disposable or reusable as desired for a particular use environment. Any component could be provided with a user-perceptible marking to indicate a material, configuration, at least one dimension, or the like pertaining to that component, the user-perceptible marking aiding a user in selecting one component from an array of similar components for a particular use environment. A "predetermined" status may be determined at any time before the structures being manipulated actually reach that status, the "predetermination" being made as late as immediately before the structure achieves the predetermined status. Though certain components described herein are shown as having specific geometric shapes, all structures of this disclosure may have any suitable shapes, sizes, configurations, relative relationships, cross-sectional areas, or any other physical characteristics as desirable for a particular application. Any structures or features described with reference to one embodiment or configuration could be provided, singly or in combination with other structures or features, to any other embodiment or configuration, as it would be impractical to describe each of the embodiments and configurations discussed herein as having all of the options discussed with respect to all of the other embodiments and configurations. A device or method incorporating any of these features should be understood to fall under the scope of this disclosure as determined based upon the claims below and any equivalents thereof.

Other aspects, objects, and advantages can be obtained from a study of the drawings, the disclosure, and the appended claims.

We claim:

1. A circuit card rack system, comprising:
a card rack including a laterally oriented clamping slot, the clamping slot being at least partially formed from a temperature-contractible material, the temperature-contractible material being a first temperature-contractible material having a first coefficient of thermal expansion; and
a circuit card having a clamped side region and being at least partially formed from a second temperature-contractible material different from the first temperature-contractible material and having a second coefficient of thermal expansion which is different from the first coefficient of thermal expansion, the circuit card having an operative configuration with at least a portion of the clamped side region being inserted into the clamping slot;
wherein, when the circuit card is in the operative configuration, applying a predetermined temperature differential to the clamping slot reduces a longitudinal dimension of at least a portion of the clamping slot via thermal expansion of the clamping slot, and applying the predetermined temperature differential to the clamped side region reduces the longitudinal dimension of at least a portion of the clamped side region which is located longitudinally within the clamping slot, the thermally-induced reduction of the longitudinal dimension of the clamped side region being less than the thermally-induced reduction of the longitudinal dimension of the claiming slot, thus causing exertion of a compressive force on the portion of the clamped side region which is located longitudinally within the clamping slot via thermal expansion of the clamping slot.

2. The system of claim 1, wherein the predetermined temperature differential is a negative temperature differential, and the thermal expansion of the clamping slot is negative thermal expansion.

3. The system of claim 1, wherein the card rack includes first and second laterally oriented, laterally spaced, longitudinally aligned clamping slots, each disposed to one lateral side of an open card volume of the card rack, the first and second clamping slots each being at least partially formed from the first temperature-contractible material;
the circuit card is a substantially planar circuit card having first and second laterally spaced clamped side regions; and
the circuit card has an operative configuration with at least a portion of the first clamped side region being inserted into the first clamping slot and at least a portion of the second clamped side region being inserted into the second clamping slot with the circuit card laterally spanning at least a portion of the open card volume of the card rack.

4. The system of claim 1, wherein the circuit card has a substantially planar circuit card body including at least one laterally oriented side edge and circuit card top and bottom surfaces longitudinally separated by the circuit card body, the circuit card includes an edge feature extending substantially along at least a portion of the side edge, the edge feature has a longitudinal thickness that is substantially greater than a laterally adjacent portion of the circuit card, and the edge feature is at least partially inserted into the clamping slot in the operative configuration; and wherein the edge feature is located a selective one of:
wholly on a chosen one of the circuit card top and bottom surfaces, and
partially on the circuit card top surface and partially on the circuit card bottom surface.

5. The system of claim 1, including a spacer interposed between at least a portion of the clamped side region and at least a portion of the clamping slot.

6. The system of claim 5, wherein the spacer has a different coefficient of thermal expansion than at least the portion of the clamping slot directly adjacent to the spacer.

7. The system of claim 1, including configuring at least one of the temperature-contractible material, a dimension of the clamping slot, a dimension of the clamped side region, and the temperature differential to achieve a predetermined compressive force between the clamping slot and the clamped side region.

8. The system of claim 1, wherein a supermajority of a surface area of the clamping slot is in thermal contact with a supermajority of a surface area of the clamped side region to achieve a predetermined rate of thermal energy transfer therebetween.

9. The system of claim 1, wherein the predetermined temperature differential is applied to the clamping slot via at least one of cooling/heating channels in the card rack, exposure of an entire circuit card rack system to a desired heating/cooling energy, thermal siphon, cryogenic liquids, dilution refrigeration, Gifford-McMahon (GM) or pulse tube cryocoolers, and local exposure of at least a portion of the clamping slot to a heating/cooling agent.

10. The system of claim 2, wherein the negative thermal expansion results in the reduced longitudinal dimension of at least a portion of the clamping slot bringing the clamping slot into compressive contact with the portion of the clamped side region which is located longitudinally within the clamping slot, such that the dimensional mismatch between the clamping slot and the clamped side region which is located longitudinally within the clamping slot produces the compressive force.

* * * * *